US006961885B2

(12) United States Patent
Man et al.

(10) Patent No.: US 6,961,885 B2
(45) Date of Patent: Nov. 1, 2005

(54) SYSTEM AND METHOD FOR TESTING VIDEO DEVICES USING A TEST FIXTURE

(75) Inventors: Albert Man, Richmond Hill (CA); Raymond P C Wong, Richmond Hill (CA)

(73) Assignee: ATI Technologies, Inc., Thornhill (CA)

( * ) Notice: Subject to any disclaimer, the term of this patent is extended or adjusted under 35 U.S.C. 154(b) by 455 days.

(21) Appl. No.: 09/994,261

(22) Filed: Nov. 26, 2001

(65) Prior Publication Data

US 2003/0101395 A1 May 29, 2003

(51) Int. Cl.$^7$ .................................................. G01R 31/28
(52) U.S. Cl. ........................................ 714/727; 714/729
(58) Field of Search .................................. 714/726, 727, 714/729, 733, 724; 324/754; 348/190

(56) References Cited

U.S. PATENT DOCUMENTS

| 4,504,783 A | * | 3/1985 | Zasio et al. ................. 324/754 |
| 4,760,330 A | | 7/1988 | Lias, Jr. |
| 5,477,544 A | | 12/1995 | Botelho |
| 5,969,756 A | * | 10/1999 | Buckley et al. ............. 348/190 |
| 6,128,757 A | * | 10/2000 | Yousuf et al. .............. 714/724 |
| 6,294,908 B1 | | 9/2001 | Belmore et al. |
| 6,357,026 B1 | * | 3/2002 | Hoang et al. ............... 714/727 |
| 6,421,798 B1 | | 7/2002 | Lin et al. |
| 6,480,978 B1 | | 11/2002 | Roy et al. |
| 6,539,510 B1 | * | 3/2003 | St. Pierre et al. ........... 714/727 |
| 6,559,671 B2 | | 5/2003 | Miller et al. |
| 6,678,850 B2 | | 1/2004 | Roy et al. |
| 6,691,270 B2 | * | 2/2004 | Blasco Allue et al. ...... 714/729 |

* cited by examiner

*Primary Examiner*—David Ton
(74) *Attorney, Agent, or Firm*—Toler, Larson & Abel, LLP

(57) ABSTRACT

Systems and methods are provided for testing a device. A test fixture is provided for interfacing a device with a host system for generating tests to be run on the device. The device is placed in a scan-test mode, according to a built-in self-test of the device. A scan clock signal and scan pattern are provided to allow scan-tests to be run on the device. If the device passes the scan test, the device is placed in a real-time test mode. At-speed tests may then be run on the device to provide a robust test and identify portions of the device that may be faulty.

22 Claims, 4 Drawing Sheets

SYSTEM AND METHOD FOR TESTING VIDEO DEVICES USING A TEST FIXTURE

FIELD OF THE DISCLOSURE

The present invention relates generally to the testing of devices and more particularly to test fixtures.

BACKGROUND

Newly manufactured products are tested to ensure they conform to operating specification requirements. Depending on the type of product, various testing techniques are used. For example, for hardware devices, such as processing devices, test fixtures are created to provide an input stimulus and monitor outputs of the device for proper responses. If, for each of the input stimulus, the output is as anticipated, the printed circuit board passes the test.

Some processing devices include built-in self-test (BIST) capabilities. Some processing devices include scan-testing as part of their BIST capabilities. A processing device may be broken down into a set of logic gates. The logic gates are linked together to form a serried of linked logic gates known as a scan chain. A set of input values, known as a scan pattern, is loaded into the inputs of the logic gates of the scan chain. Once all the logic gates of the scan chains have been assigned an input value, the input values are latched into associated logic gates. The outputs of the logic gates may then be shifted out from the scan chain. The outputs from the scan test are compared to known outputs. If the tested outputs match the known outputs, the device is considered good. If the tested outputs are not equivalent to the known outputs, the device has failed. By analyzing which outputs from the scan chain were incorrect, specific faulty portions of the processing device may be identified. While scan-testing allows specific faulty portions of a processing device to be identified, scan-testing does not test all the capabilities of a processing device.

To adequately test a particular processing device, the processing device must be tested against operating conditions in which the processing device will be used, such as through at-speed tests. General-purpose, automated test equipment is generally used to test processing devices, such as microprocessors, microcontrollers, video graphic processors, etc. A simulated design verification suite, based on a hardware description language, of an integrated circuit being tested is used to create a virtual environment to test the integrated circuit. While the automated test equipment provides flexibility such that various processing devices may be tested, it is generally a costly piece of equipment (e.g., approximately $2 Million Dollars U.S.). The development of the customized test program is somewhat time consuming, which adds additional costs to the overall automated testing process. Furthermore, while capabilities of the processing device may be verified while testing the processing device in a particular environment, specific faulty portions of the processing device may not be identified. From the above discussion it is apparent that an improved system for testing a processing device is needed.

BRIEF DESCRIPTION OF THE DRAWINGS

Specific embodiments of the present invention are shown and described in the drawings presented herein. Various objects, advantages, features and characteristics of the present invention, as well as methods, operations and functions of related elements of structure, and the combination of parts and economies of manufacture, will become apparent upon consideration of the following description and claims with reference to the accompanying drawings, all of which form a part of this specification, and wherein:

DETAILED DESCRIPTION OF THE FIGURES

At least one embodiment of the present invention provides for a method of production testing a video device. The method includes mounting a device on a test fixture. The test fixture is connected to a general-purpose computer. The general-purpose computer is used to provide commands to the test fixture for running a scan test. The method includes testing the device using scan techniques. The testing includes serially providing a first test vector to the device and clocking the device to assert the first test vector within the device. The first test vector may include a scan pattern clocked into at least a first scan chain of the device. The testing also includes serially providing a second test vector to the device. The testing further includes a step of receiving results from the first test vector concurrently with the step of providing the second test vector. The results are then compared to expected results to determine if the device is operating properly. In one embodiment, the method also includes providing at-speed testing of the device.

Figure 1:
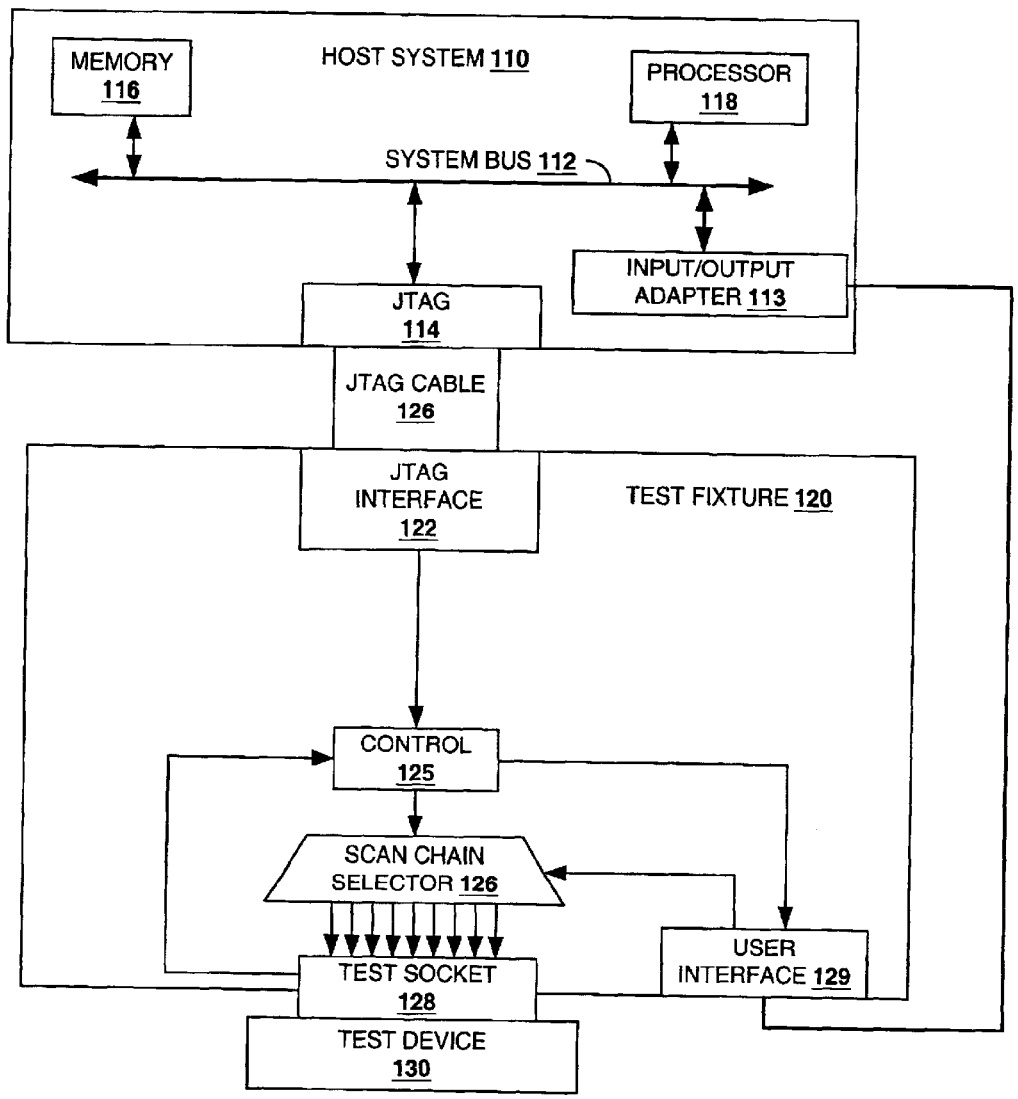
FIG. 1 is a block diagram illustrating a system for scan-testing a processing device, according to one embodiment of the present invention.

Referring now to FIG. 1, a block diagram illustrating a system for scan-testing a video processing device, test device 130, is shown, according to one embodiment of the present invention. A general-purpose computer, host system 110, is used to generate and load a scan-test pattern (not shown) into test device 130 for performing a scan-test. Test device 130 is broken down into several scan-chains for testing. A user interface 129 may be provided to allow a user to select a particular scan chain to be tested in test device 130. A user may also monitor any output results generated from test device 130, through user interface 129.

Host system 110 includes a general-purpose information handling system. A processor 118 provides functionality to handle general processing for host system 110. Processor 118 runs applications stored in memory 116. In one embodiment, processor 118 is used to run a scan-test application (not shown) stored in memory 116. The scan-test application is used to generate control signals for running a scan-test within a processing device, such as test device 130. The control signals include signals to initiate a built in self test (BIST) within test device 130. The scan-test application provides a scan pattern to load into a selected scan chain of test device 130. A Joint Test Action Group (JTAG) port 114 provides the control signals, a clock signal and serialized data, to test fixture 120, through a JTAG cable 126. In one embodiment, test fixture 120 includes a JTAG interface 122 to interface with JTAG port 114, through JTAG cable 126. It should be appreciated that other forms of interfaces may be used in place of JTAG port 114 without departing from the scope of the present invention. For example, a serial or parallel port may be used to interface between host system 110 and test fixture 120. For example, in an alternate embodiment, the control signals are provided through a parallel port; accordingly, a serial shifter may be used to convert parallel control data into serialized control data.

A control module 125 is used to initiate a scan-test within test device 130. Logic gates (not shown) in test device 130 are organized together as scan chains, to allow them to be linked for testing. In one embodiment, the logic gates are organized into subsets of scan chains. The scan pattern generated by the test application in memory 116 is loaded into a particular scan chain to test the logic gates of the particular scan chain. In one embodiment, a scan chain to be tested is selected through a scan chain selector 126. In one embodiment, the scan chain to be tested is manually wired to control module 125 by a user. A user interface 129 may be provided to allow the user to select a scan chain of scan chain selector 126. Alternatively, a user on host system 110 may select scan chains to be tested. In another embodiment, the test application generates control signals to indicate to scan chain selector 126 which of the available scan chains of test device 130 to test. Control signals for selecting scan chains may be sent by host system 110 through JTAG port 126. Alternatively, host system 110 may provide control signals for selecting scan chains through an input/output adapter 113. Input/output adapter 110 includes an interface for communicating with host system 110, such as a serial or parallel port interface.

Scan chain selector 126 provides the scan pattern to a selected scan chain of test device 130, through test socket 128. A clock signal (not shown) may also be provided to test device 130 to allow the scan pattern to be clocked into the gates of the selected scan chain. In one embodiment, once the scan pattern has been loaded into all the logic gates of the selected scan-chain, the logic gates of the scan chain are clocked to allow test results to be generated. In one embodiment, the output values from each of the logic gates of the scan chain are shifted to generate a stream of test results. It should be noted the process of selecting a scan chain and loading a scan pattern into the scan chain may be repeated for a plurality of scan chains to be tested. Once the plurality of scan chains have scan patterns loaded into them, all of the selected scan chains may be clocked in unison to generate multiple sets of output results. Each of the results may then be compared to expected results known for each particular scan chain used.

In one embodiment, the test results are read by control module 125, through test socket 128. The test results may be provided back to host system 110 for analyses by the test application. Alternatively, the test results may be provided to a user for analyses, such as through user interface 129. The user may use a signal probe to analyze the generated test results. Alternatively, the test results may be read by host system 110 through input/output adapter 113. The test results are compared to a set of known test results associated with the selected scan chain and the scan pattern. If the test results are equivalent to the known results, the logic gates of the scan chain have passed the scan-test. If the test results are different from the known results, the logic gates have failed the scan-test. The faulty values of the test results may be analyzed to determine which of the logic gates in the scan chain are faulty. For example, a third logic gate of the scan chain may be associated with a third value of the test results. Accordingly, if the third value of test results if wrong, the third logic gate of the scan chain may be considered faulty. It should be noted that while control 125 and scan chain selector 126 have been shown as part of test fixture 120, in an alternate embodiment, control 125 and scan chain selector 126 form internal components of test device 130. Accordingly, commands provided to test device 130, through test fixture 120, would be used to send control commands to control module 125 and select scan chains through scan chain selector 126 within test device 130.

Figure 2:
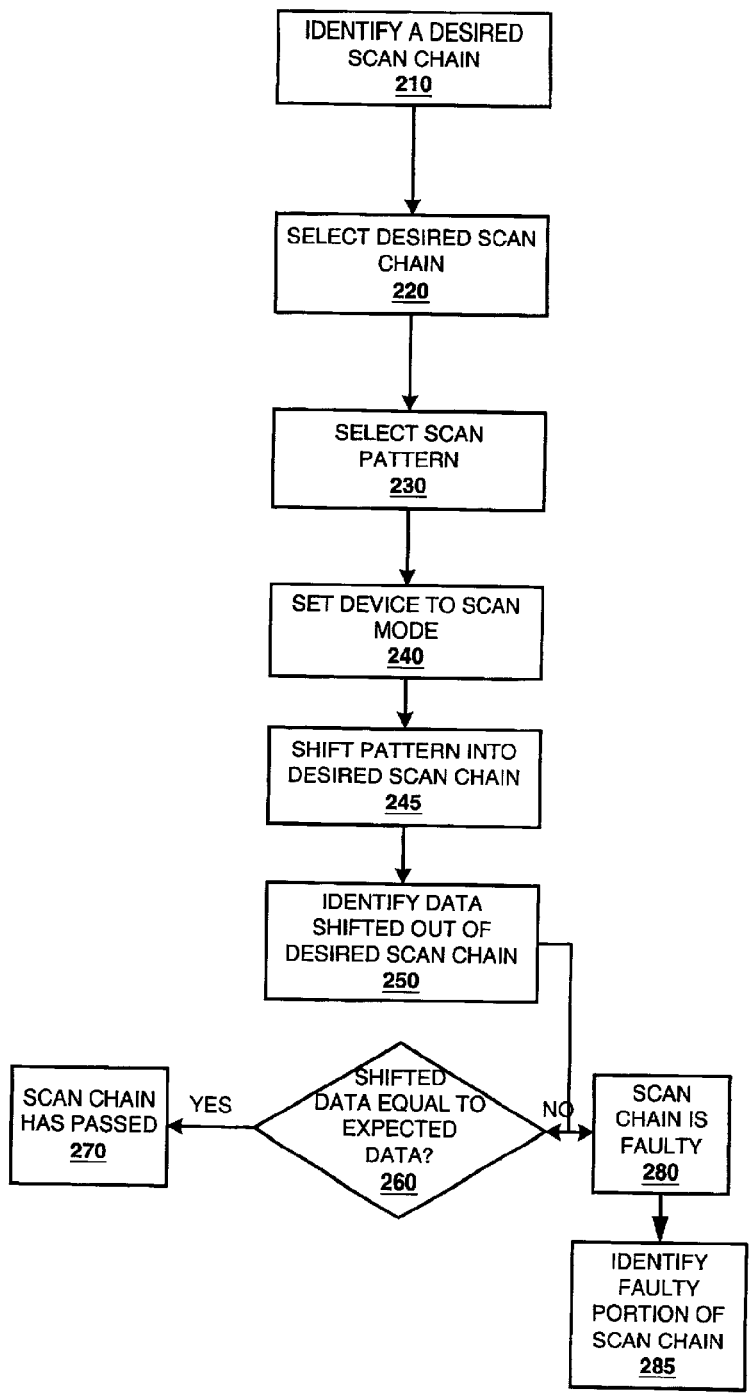
FIG. 2 is a flow diagram illustrating a method of scan-testing a processing device, according to one embodiment of the present invention.

Referring now to FIG. 2, a flow diagram illustrating a method of scan-testing a processing device is shown, according to one embodiment of the present invention. A device with a built in self-test may include dual modes of operation. In a first mode of operation, the device is allowed to operate in a normal mode, processing data according to its design. In a second mode of operation, the device is in a scan-test mode. Logic gates within the device may be linked together as a single chain, a scan chain. Values may be loaded into the individual logic gates of a scan chain. The output of the gates may then be read to determine if any of the logic gates of the scan chain are faulty.

In step 210, a particular scan chain to test is identified. While a single scan chain may be constructed to test all the logic gates of the device, the time to load values into the entire scan chain is longer than using smaller subsets of scan chains. In one embodiment, a test pattern may be loaded into all the scan chains for concurrent testing. Alternatively, to test only a particular portion of the device, only a scan chain associated with the particular portion of the device may need to be tested. The desired scan chain to be tested is selected from a plurality of scan chains associated with the device to be tested.

In step 220, the desired scan chain is selected within a test fixture. In one embodiment, access to different scan chains is provided through settings within the test fixture, such as test fixture 120 (FIG. 1), used to interface with the device. The access to the desired scan chain may be provided by manually connecting wires to a circuit network associated with the desired scan chain. In one embodiment, a multiplexer is provided to select the desired scan chain. A test application may also be used to provide signals to the test fixture to select the desired scan chain.

In step 230, a scan pattern is selected. The scan pattern represents the values that will be loaded into the logic gates of the scan chain. It should be noted that to adequately test a particular scan chain, several different scan patterns may be needed. In one embodiment, the scan pattern is selected through a test application within a host system connected to the test fixture. The test application provides the scan pattern to the test fixture. Different scan patterns may be preloaded in the test application, allowing a user to select a scan pattern to use. Alternatively, the user may provide a test pattern to be loaded. In one embodiment, the test pattern is repeated throughout the scan chain, allowing all the logic gates of the scan chain to be loaded with a value of the scan pattern.

In step 240, the device to be tested is placed in a scan-test mode. Control signals are sent to the device being tested to engage the built in self test and prepare the device to receive the scan pattern. In one embodiment, the control signals are sent to the device via a JTAG port. The control signals include commands for setting the device being tested in a debug mode. The device may support a variety of test modes, which are engaged through commands received by the device through a JTAG port.

In step 245, the selected scan pattern is shifted into the desired scan chain. A clock signal is provided to the device to allow the scan pattern values to be provided to the inputs of the scan chain logic gates. Once the inputs of the logic gates all have a value of the scan pattern, a clock pulse is provided to latch the input values into the logic gates. In step 250, once all the logic gates have values of the scan pattern, the test fixture shifts out the outputs of the scan chain logic gates. It should be noted that multiple scan chains may be selected and provided scan patterns. All the scan chains may then be tested by shifting out the values of the different scan chains.

In step 260, the data shifted out of the scan chain is compared to a set of expected results. It should be noted that the set of expected results may be unique to the scan pattern used and the scan chain being tested. If the scan chain tested is changed or the scan pattern is changed, the expected results may also change. Accordingly, expected results should be known for the particular scan chain being tested with the particular scan pattern used. In step 270, if the shifted output data is equivalent to the expected results, the scan chain has passed the test. As previously discussed, further testing may also be performed using a different scan pattern to ensure the scan chain is truly working. In step 280, if the shifted output results do not match the expected results, the scan chain has failed the scan-test. In step 285, the particular portion of the scan chain that has failed is identified. The shifted output data values that did not match the expected results may be examined to determine which logic gates of the scan chain failed the scan-test.

Figure 3:
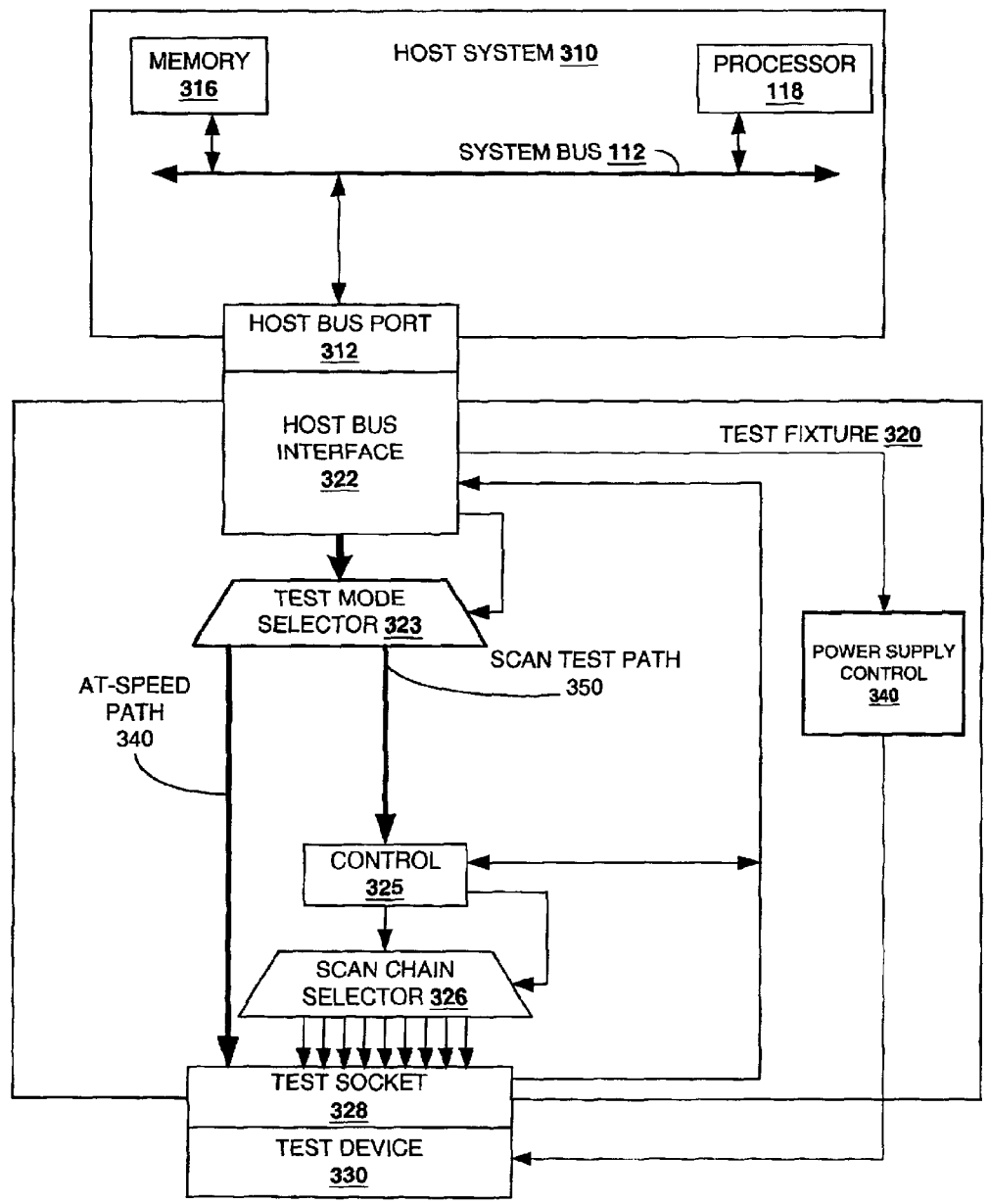
FIG. 3 is a block diagram illustrating a system for providing both scan-testing and at-speed testing of a processing device, according to one embodiment of the present invention.

Referring now to FIG. 3, a block diagram illustrating a system for providing both scan-testing and at-speed testing of a processing device is shown, according to one embodiment of the present invention. A host system 310 generates control signals for testing a device, such as test device 330. The host system 310 generates commands for two types of tests, an at-speed test and a scan-test. The at-speed tests are run to test the operations of test device 330 at a speed in which test device 330 is expected to operate at. The host system 310 also may switch the test device 330 to a scan-test in which particular scan chains of test device 330 are tested by shifting in scan patterns.

Host system 310 includes a processor for running applications stored in memory 316. In one embodiment, memory 316 includes a test application (not shown). The test application is capable of running commands to initiate either an at-speed test or a scan-test of test device 330, through test fixture 320. Commands generated through the test application are provided to a host bus port 312, through system bus 112. Test fixture 320 includes a host bus interface 322 for interfacing with host bus port 312 of host system 310. In one embodiment host bus port 312 is an accelerated graphics port (AGP). Host bus port 312 may also include a peripheral component interconnect (PCI) bus port or a JTAG port.

In one embodiment, commands provided through the host bus interface unit 322 are used to select a test mode within test fixture 320, through test mode selector 323. Test mode selector 323 may then route the test signals through one of two paths, an at-speed test path 340 and a scan-test path 350. Test commands sent along the at-speed path 340 are sent to test socket 328 to allow the test device 330 to process the test commands under a speed and operating conditions in which the test device 330 is expected to run. In one embodiment, the test device 330 may operate in either a scan test mode or an at-speed test mode, exclusively. A save and restore procedure may be employed to ensure the test device 330 is put in a proper operative mode without powering down the test device 330. A power supply control 340 may include circuitry to control power-up or power-down sequences used during testing of test device 330.

In one embodiment, commands sent to control module 325 are used to select a particular scan chain of test device 330 to be tested. In one embodiment, scan chain selector 326 is a demultiplexer which provides data provided by control 325 to a particular circuit network associated with particular scan chains. Scan chain selector 326 may also include a switch to allow a particular scan chain network to be selected. Scan chain selector 326 provides scan patterns provided by control module 325 to the test device 330, through test socket 328.

Results from the tests, either at-speed tests or scan-tests, may be sent back to host system 320, through host bus interface 322, for analysis. In one embodiment, the test results are analyzed by the test application in memory 316. The test application may be used to compare test results against known results. At-speed tests may be analyzed to determine if any anomalies in the processing performed by test device 330 are present. In one embodiment, if any anomalies are detected during at-speed tests, the host system 310 switches to a scan-test mode. The test device 330 is halted and test commands are processed through the scan-test path 350. Test results may be compared against expected scan-test results to determine if any of the logic gates of test device 330 are faulty. Alternatively, a scan test may be run to and the test device 330 may be halted to switch to at-speed tests. Portions of test device 330 which are faulty or degrading performance may be identified, as described further in reference to FIG. 4.

Figure 4:
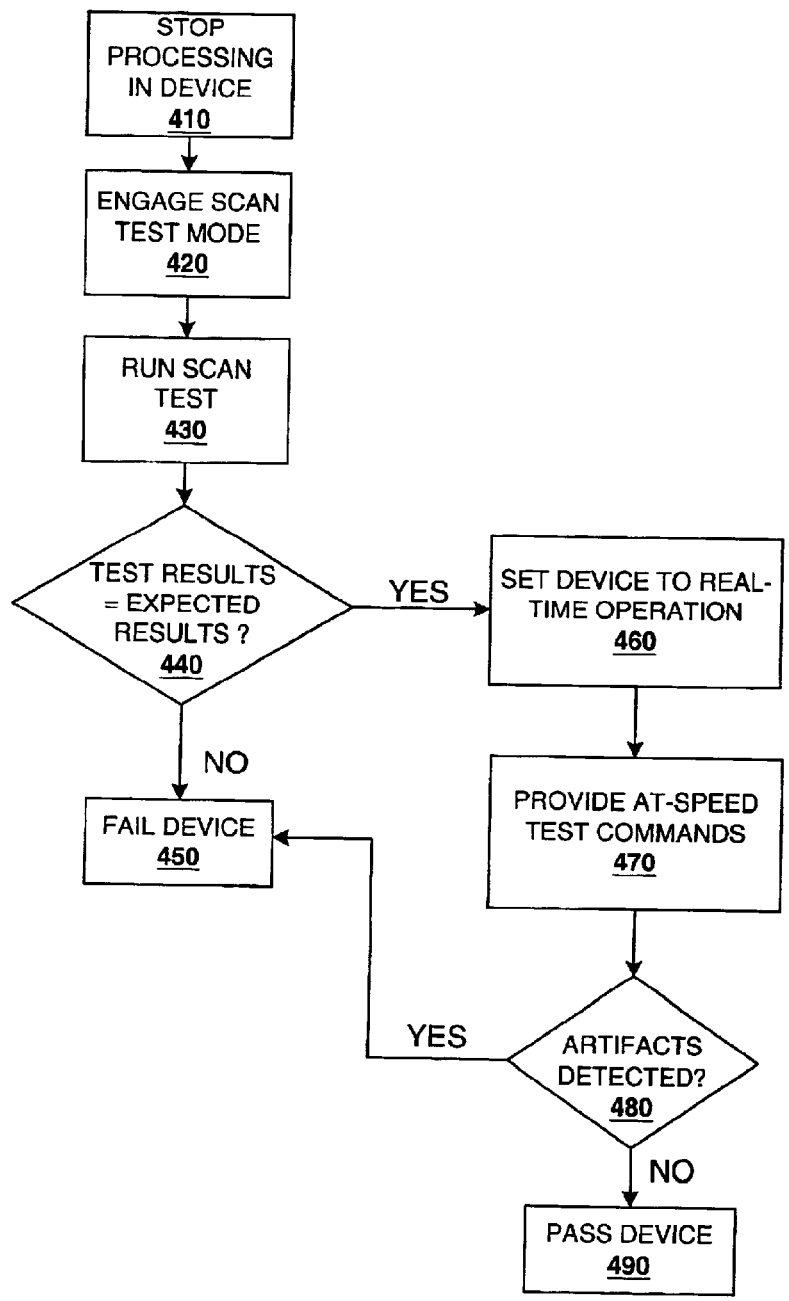
FIG. 4 is a flow diagram illustrating a method of handling both scan and at-speed tests of a processing device, according to one embodiment of the present invention.

Referring now to FIG. 4, a flow diagram illustrating a method of handling both scan and at-speed tests of a processing device is shown, according to one embodiment of the present invention. A device is tested using a scan test. If the device passes the scan test, the device is set to an at-speed test mode to provide more robust testing. An at-speed test may be performed to identify the source of the problem with the device.

In step 410, processing in the device to be tested is halted to allow a scan test to be engaged. In step 420, a scan test mode of the device is engaged. In one embodiment, the device is capable of being placed in a scan test mode using commands received by the device through a JTAG port. For example, commands may be sent to the device to engage a BIST associated with the device. A particular scan chain may be selected for testing. In one embodiment, the device includes a plurality of scan chains. To test particular portions of the device, particular scan chains, which may include specific components associated with particular processing functions of the device, are selected for testing. A scan pattern for testing the selected scan chains may also be selected. In step 430, the scan-test is run on the device. The selected scan pattern is loaded into the selected scan chains. Once all the components, or logic gates, associated with the selected scan chains have values, the components are clocked to determine the results of the scan-test. The outputs of the scan-test are read from the device being tested.

In step 440, the test results are compared to a set of expected results. For every scan chain tested with a particular scan pattern, a unique set of test results is expected. If the test results match the expected results, the device is considered to pass the scan test. In one embodiment, if the device passes the scan test, the device is set to real-time operation for further testing, as in step 460. Alternatively, the device may be placed in a "good part" bin which may indicated the scan test has passed, allowing the device to be picked up at a later time to proceed with at-speed testing. In step 450, if the test results do not equal the expected results, the device has failed testing and is considered faulty. The device may be placed in a "bad part" bin, indicated the device has failed testing. In one embodiment, the particular scan chain that failed the scan-test is analyzed to determine which portion of the device being tested is faulty, allowing an assessment of fault to be determined.

In step 460, the device is set to real time operation to prepare for at-speed testing. The device may be provided connection to other system devices and resources with which the device will operate in. The device is allowed to run with a clock representing a speed in which the device is expected to operate within. In step 470, at-speed test commands are provided to the device being tested. The at-speed test commands include processing commands which the device to be tested is expected to adequately process at a real-time speed. In one embodiment, the device to be tested includes a graphics processor. Accordingly, the at-speed test commands may include three-dimensional (3-D) graphics processing commands.

In step 480, it is determined if any artifacts are present. Processing results from the test commands being run on the device are compared to expected results. In one embodiment, a resulting frame-rate is compared to a target frame rate to determine if the device is processing as expected. In step 490, if no artifacts are detected, the device is considered to be operating correctly and is passed. Alternatively, more test commands may be sent to the device is provide more thorough testing. Devices that have passed testing may be placed in a "good part" bin to indicate the device has passed testing. If artifacts are detected in step 480, the device may be considered faulty and fail the testing, as in step 450.

The systems described herein may be part of an information handling system. The term "information handling system" refers to any system that is capable of processing information or transferring information from one source to another. An information handling system may be a single device, such as a computer, a personal digital assistant (PDA), a hand held computing device, a cable set-top box, an Internet capable device, such as a cellular phone, and the like. Alternatively, an information handling system may refer to a collection of such devices. While the present disclosure has been described in reference to testing a video device, it should be appreciated that the present invention may be used for testing other types of devices. For example, the present invention may be used for production testing audio devices, signal processing devices, video gaming devices, computing processors and the like. It should be appreciated that the system described herein has the advantage of providing an improved production testing of a device.

In the preceding detailed description of the embodiments, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present invention is defined only by the appended claims.

What is claimed is:

1. A method of production testing a video device comprising:
    coupling a device to a test fixture, wherein the test fixture is coupled to a general-purpose computer;
    testing the device using one or more scan techniques, wherein testing the device includes:
        serially providing a first test vector to the device via the test fixture;
        clocking the device to assert the first test vector within the device;
        serially providing a second test vector to the device via the test fixture;
        receiving results from the first test vector concurrently with the step of providing the second test vector; and
        comparing the results with expected results.

2. The method as in claim 1, wherein testing the device using the one or more scan-test techniques includes determining, after comparing the results, if the device has passed a scan-test, wherein the device has passed the scan-test when the results are equivalent to the expected results and the device has failed the scan-test when the results are different from the expected results.

3. The method as in claim 2, wherein testing the device using the one or more scan-test techniques further includes placing the device in a good bin when the device has passed the scan-test.

4. The method as in claim 3, wherein the device is taken from the good bin for testing the device using an at speed test.

5. The method as in claim 2, wherein testing the device using the one or more scan-test techniques further includes placing the device in a bad bin when the device has failed the scan-test.

6. The method as in claim 1, wherein the device is a video processing device.

7. The method as in claim 1, wherein serially providing the first test vector to the device includes providing multiple chains of serial test vector values to separate sets of components of the device for concurrently testing the sets of components.

8. The method as in claim 1, further including:
    selecting one of an at speed test mode and a scan-test mode; and
    testing the device using an at-speed test when the at speed test mode is selected.

9. The method as in claim 8, wherein the device is tested using the one or more scan techniques before the device is tested using the at speed test.

10. The method as in claim 1, wherein the general-purpose computer includes one of a peripheral component interconnect port, an accelerated graphics port, a serial part, a JTAG port, or a parallel port for interfacing with the test fixture.

11. A system comprising:
    a general purpose computer having:
        a data processor having an input/output buffer;
        memory having an input/output buffer coupled to the input/output buffer of the data processor, said memory including a set of instructions to provide a scan-test pattern for testing a device;
        a communications port having an input/output buffer coupled to the input/output buffer of the data processor;

a test fixture having:
  a communications interface coupled to the communications port, the communications port to receive said scan-test pattern;
  a scan-chain selector for selecting a particular scan-chain of a plurality of scan chains in said device for testing;
  a control module to:
    generate signals to set said device in a scan-test mode;
    provide said signals to a device socket;
    load said scan-test pattern, through said device socket, into said particular scan-chain of said device;
    provide a clock signal to said device socket, wherein said clock signal is to latch output results from said particular scan-chain;
  said device socket for interfacing with said device, said device socket to:
    provide said signals and said scan-test pattern from said control module to said particular scan-chain of said device and;
    receive said output results.

12. The system: as in claim 11, wherein said communications port includes a JTAG port.

13. The system as in claim 11, wherein said communications port includes an accelerated graphics port.

14. The system as in claim 11, wherein said scan chain selector is configured by a user to select said particular scan chain.

15. The system as in claim 11, wherein said scan-chain selector is configured by said set of instructions, through said control module.

16. The system as in claim 11, wherein said device includes a graphics processor.

17. A test fixture comprising:
  a bus interface for receiving test signals;
  a test mode selector coupled to the bus interface, said test mode selector to route said test signals from said bus interface to one of an at-speed operating path and a scan-test path;
  a scan-test control module coupled to said scan-test path of said test mode selector, said scan-test control module to:
    engage a scan-test mode in a device;
    selecting a particular scan-chain of a plurality of scan-chains associated with said device;
    providing a scan pattern to a test socket, wherein said scan pattern is loaded into said scan-chain;
    receiving results from said device, wherein results are related to said scan pattern;
  a test socket having:
    a first input/output buffer coupled to said at-speed operating path of said test mode selector;
    a second input/output buffer coupled to said scan-test path of said test mode selector; and
    a third input/output buffer coupled buffer coupled to said device.

18. The test fixture as in claim 17, wherein said bus interface includes an accelerated graphics port interface.

19. The test fixture as in claim 17, wherein said bus interface is coupled to a bus port of an information handling system.

20. The test fixture as in claim 17, wherein the test mode selector is configured through said test signals to select from one of the at-speed operating path and the scan-test path.

21. The test fixture as in claim 17, wherein the at-speed operating path is used to provide test signals associated with at-speed tests.

22. The test fixture as in claim 17, wherein said device includes a graphics processor.

* * * * *

UNITED STATES PATENT AND TRADEMARK OFFICE
CERTIFICATE OF CORRECTION

PATENT NO. : 6,961,885 B2  Page 1 of 1
APPLICATION NO. : 09/994261
DATED : November 1, 2005
INVENTOR(S) : Albert Man et al.

It is certified that error appears in the above-identified patent and that said Letters Patent is hereby corrected as shown below:

Column 9, line 24: Please change "system: as" to --system as--

Signed and Sealed this

Eighth Day of January, 2008

JON W. DUDAS
*Director of the United States Patent and Trademark Office*